United States Patent
Okabe et al.

(10) Patent No.: US 10,636,855 B2
(45) Date of Patent: Apr. 28, 2020

(54) DISPLAY DEVICE

(71) Applicant: Sharp Kabushiki Kaisha, Sakai, Osaka (JP)

(72) Inventors: Tohru Okabe, Sakai (JP); Ryosuke Gunji, Sakai (JP); Hiroki Taniyama, Sakai (JP); Shinsuke Saida, Sakai (JP); Hiroharu Jinmura, Sakai (JP); Yoshihiro Nakada, Sakai (JP); Akira Inoue, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/464,309

(22) PCT Filed: Sep. 28, 2017

(86) PCT No.: PCT/JP2017/035247
§ 371 (c)(1),
(2) Date: May 28, 2019

(87) PCT Pub. No.: WO2019/064436
PCT Pub. Date: Apr. 4, 2019

(65) Prior Publication Data
US 2019/0386081 A1    Dec. 19, 2019

(51) Int. Cl.
*H01L 27/32* (2006.01)
*H01L 51/00* (2006.01)
*H01L 51/52* (2006.01)

(52) U.S. Cl.
CPC ............ *H01L 27/326* (2013.01); *H01L 27/32* (2013.01); *H01L 27/3223* (2013.01); *H01L 27/3225* (2013.01); *H01L 27/3237* (2013.01); *H01L 27/3258* (2013.01); *H01L 27/3279* (2013.01); *H01L 51/0097* (2013.01);
(Continued)

(58) Field of Classification Search
CPC . H01L 27/32; H01L 27/3223; H01L 27/3225; H01L 27/3237; H01L 27/3248; H01L 27/3258; H01L 27/326; H01L 51/52; H01L 51/5237; H01L 51/5253
See application file for complete search history.

(56) References Cited

U.S. PATENT DOCUMENTS

2017/0179210 A1   6/2017   Kimura et al.
2017/0194404 A1   7/2017   Park et al.
(Continued)

FOREIGN PATENT DOCUMENTS

JP   2007-288078 A   11/2007
JP   2017-116904 A   6/2017
JP   2017-120775 A   7/2017

OTHER PUBLICATIONS

Official Communication issued in International Patent Application No. PCT/JP2017/035247, dated Dec. 5, 2017.

*Primary Examiner* — Eduardo A Rodela
(74) *Attorney, Agent, or Firm* — Keating & Bennett, LLP

(57) ABSTRACT

In a display region of a display device, opening portions are formed in at least one layer of an inorganic insulating film making up a TFT layer in such a manner as to penetrate the inorganic insulating film to thereby expose an upper surface of a resin substrate, opening flattening films are provided in such a manner as to fill in the opening portions, and metallic layers are provided in such a manner as to cover upper surfaces of the opening flattening films.

20 Claims, 11 Drawing Sheets

(52) U.S. Cl.
 CPC .......... *H01L 51/52* (2013.01); *H01L 51/5218* (2013.01); *H01L 2251/5338* (2013.01)

(56) References Cited

U.S. PATENT DOCUMENTS

| | | | |
|---|---|---|---|
| 2017/0263895 A1* | 9/2017 | Lee | H01L 27/3246 |
| 2018/0061917 A1* | 3/2018 | Kim | H01L 27/3258 |
| 2018/0286938 A1* | 10/2018 | Moon | H01L 27/3262 |
| 2018/0315809 A1* | 11/2018 | Kim | H01L 51/0097 |
| 2018/0342707 A1* | 11/2018 | Lee | H01L 51/56 |
| 2019/0041915 A1* | 2/2019 | Park | H01L 27/3262 |
| 2019/0095007 A1* | 3/2019 | Jeong | G06F 1/1626 |
| 2019/0140202 A1* | 5/2019 | Jin | H01L 27/3276 |
| 2019/0164995 A1* | 5/2019 | Lee | H01L 27/124 |
| 2019/0355799 A1* | 11/2019 | Jeong | H01L 27/3276 |

* cited by examiner

DISPLAY DEVICE

TECHNICAL FIELD

The disclosure relates to a display device.

BACKGROUND ART

In recent years, organic EL display devices, which use organic electroluminescence (EL) elements and are of the self-luminous type, have attracted attention as a display device that can replace the liquid crystal display device. For these organic EL display devices, a flexible organic EL display device is proposed in which an organic EL element is formed on a resin substrate having flexibility.

For example, PTL 1 discloses a flexible organic light emitting diode display device in which a plurality of trenches that penetrate a first buffer layer covering a first wiring line, a second buffer layer covering a second wiring line, and an intermediate insulation film covering a gate element are disposed at a bending area of a non-display region.

CITATION LIST

Patent Literature

PTL 1: JP 2017-120775 A

SUMMARY

Technical Problem

Incidentally, in the organic light emitting diode display device disclosed in PTL 1, although the light emitting element can be restrained from being damaged by dispersing the deflection stress in the bending area disposed in the non-display region that surrounds the display region, since no consideration is taken in relation to bending in the display region, there are fears that the light emitting element is damaged.

The disclosure has been made in view of the problem described above, and an object thereof is to suppress the damage to the light emitting element that would be caused by bending in the display region.

Solution to Problem

To achieve the object, according to the disclosure, there is provided a display device including a resin substrate and a light emitting element provided on the resin substrate via a TFT layer, the light emitting element making up a display region, wherein, in the display region, an opening portion is formed in at least a layer of an inorganic insulating film making up the TFT layer in such a manner as to penetrate the inorganic insulating film to expose an upper surface of the resin substrate, an opening flattening film is provided in such a manner as to fill in the opening portion, and a metallic layer is provided in such a manner as to cover an upper surface side of the opening flattening film.

Advantageous Effects of Disclosure

According to the disclosure, in the display region, since the opening portion is formed in at least the layer of the inorganic insulating film making up the TFT layer, the opening flattening film is provided in such a manner as to fill in the opening portion, and the metallic layer is provided in such a manner as to cover the upper surface side of the opening flattening film, the light emitting element can be restrained from being damaged by bending in the display region.

DESCRIPTION OF EMBODIMENTS

Embodiments of the disclosure will be described below in detail with reference to the drawings. The disclosure is not limited to the embodiments described below.

First Embodiment

Figure 1:
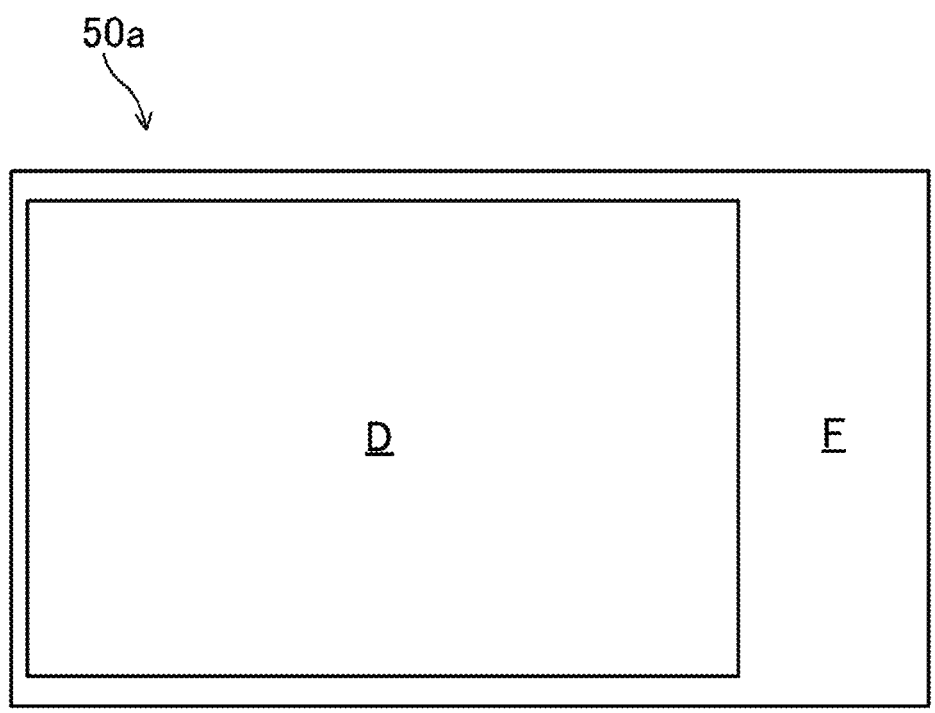
FIG. 1 is a plan view of an organic EL display device according to a first embodiment of the disclosure.
Figure 2:
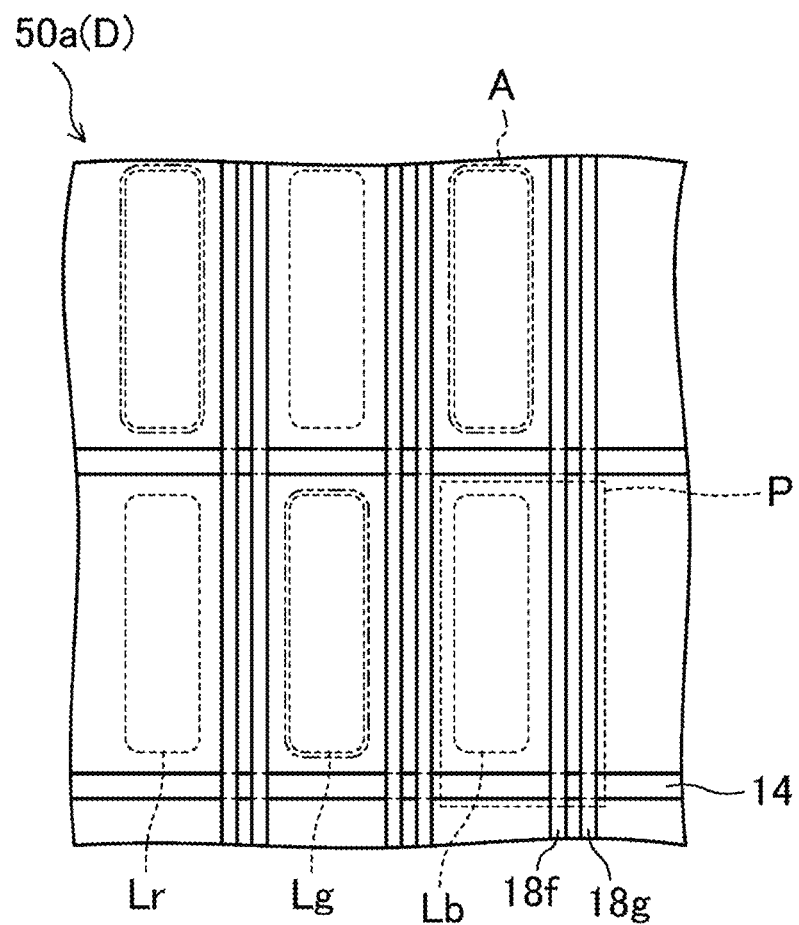
FIG. 2 is a plan view of a display region of the organic EL display device according to the first embodiment of the disclosure.
Figure 3:
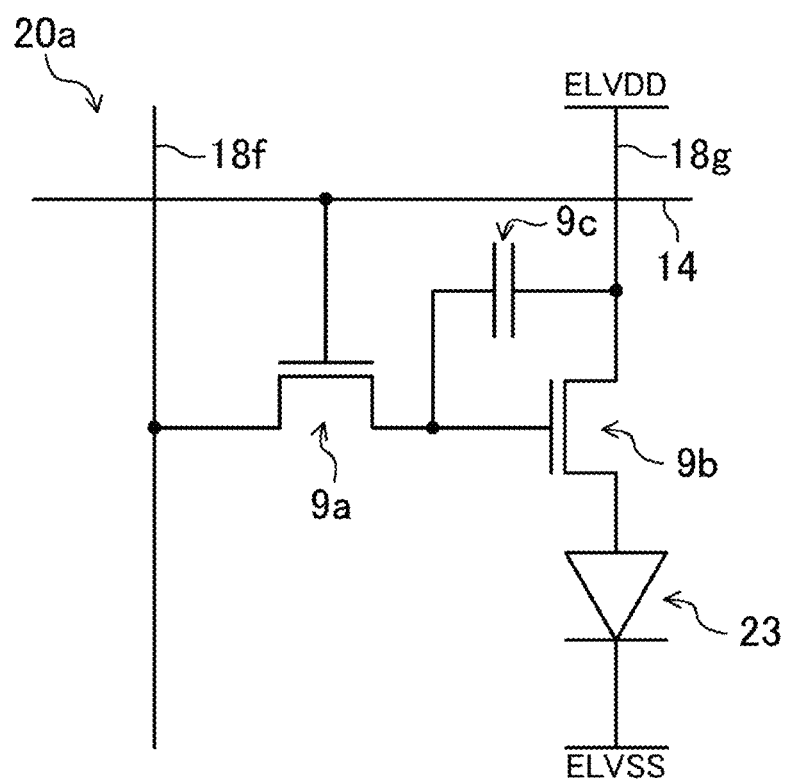
FIG. 3 is an equivalent circuit diagram illustrating a TFT layer making up the organic EL display device according to the first embodiment of the disclosure.
Figure 4:
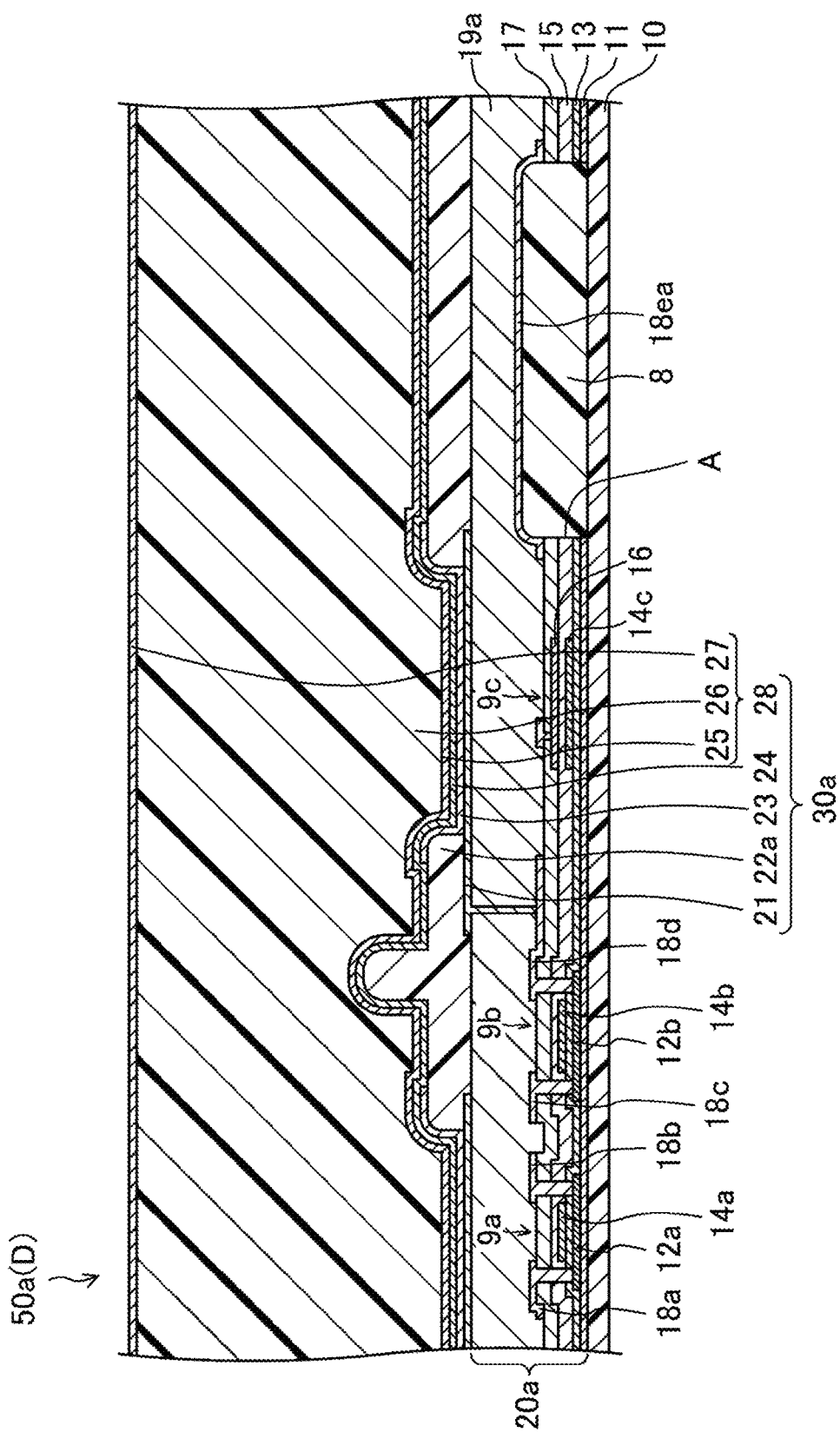
FIG. 4 is a cross-sectional view of the display region of the organic EL display device according to the first embodiment of the disclosure.
Figure 5:
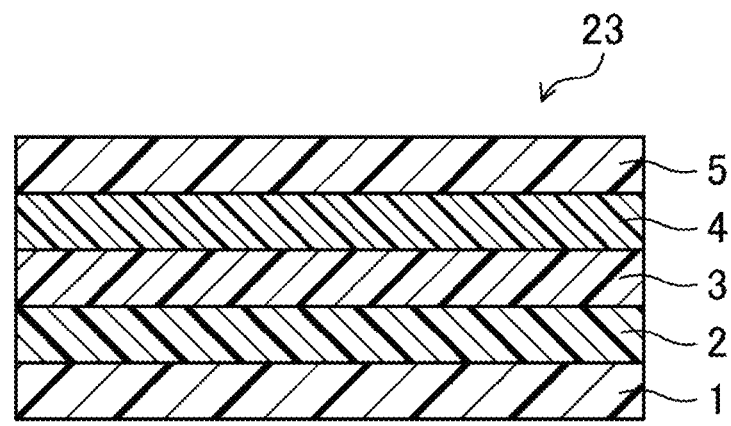
FIG. 5 is a cross-sectional view illustrating an organic EL layer making up the organic EL display device according to the first embodiment of the disclosure.

FIGS. 1 to 9 illustrate a first embodiment of a display device according the disclosure. In each of the following embodiments, an organic EL display device including an organic EL element will be described as a display device including a light emitting element. Here, FIG. 1 is a plan view of an organic EL display device 50a of the embodiment. FIG. 2 is a plan view of a display region D of the organic EL display device 50a. FIG. 3 is an equivalent circuit diagram illustrating a TFT layer 20a making up the organic EL display device 50a. FIG. 4 is a cross-sectional view of the display region D of the organic EL display device 50a. FIG. 5 is a cross-sectional view illustrating an organic EL layer 23 making up the organic EL display device 50a. FIGS. 6 to 9 are plan views illustrating arrangements of opening portions A and metallic layers 18eaa to 18ead of first to fourth modified examples of the organic EL display device 50a.

As illustrated in FIG. 1, the organic EL display device 50a includes the display region D configured to display an image specified in a rectangular shape, and a frame region F defined to surround the display region D. Here, a plurality of subpixels P are disposed in a matrix configuration in the display region D of the organic EL display device 50a, as illustrated in FIG. 2. In the display region D of the organic EL display device 50a, a subpixel P including a red light emitting region Lr configured to execute a red gray scale display, a subpixel P including a green light emitting region Lg configured to execute a green gray scale display, and a subpixel P including a blue light emitting region Lb configured to execute a blue gray scale display are provided adjacent to one another. One pixel is made up of the three adjacent subpixels P including the red light emitting region Lr, the green light emitting region Lg, and the blue light emitting region Lb, respectively in the display region D of the organic EL display device 50a.

As illustrated in FIG. 4, the organic EL display device 50a includes a resin substrate layer 10, and an organic EL element 30a provided on the resin substrate layer 10 via the thin film transistor (TFT) layer 20a and making up the display region D.

The resin substrate layer 10 is formed, for example, of polyimide resin or the like and is provided as a resin substrate.

As illustrated in FIG. 4, the TFT layer 20a includes a base coating film 11 provided on the resin substrate layer 10, a plurality of first TFTs 9a, a plurality of second TFTs 9b, a plurality of capacitors 9c (the first TFTs 9a, the second TFTs 9b and the capacitors 9c are all provided on the base coating film 11), and a TFT flattening film 19a provided on the first TFTs 9a, the second TFTs 9b, and the capacitors 9c. Here, in the TFT layer 20a, as illustrated in FIGS. 2 and 3, a plurality of gate lines 14 are provided in such a manner as to extend parallel to each other in a horizontal direction in the figures. In the TFT layer 20a, as illustrated in FIGS. 2 and 3, a plurality of source lines 18f are provided in such a manner as to extend parallel to each other in a vertical direction in the figures. In the TFT layer 20a, as illustrated in FIGS. 2 and 3, a plurality of power supply lines 18g are provided in such a manner as to extend parallel to each other in the lateral direction in the figures while being disposed adjacent to the corresponding source lines 18f. In the TFT layer 20a, as illustrated in FIG. 3, each of subpixel P includes the first TFT 9a, the second TFT 9b, and the capacitor 9c.

The base coating film 11 is made up of a single-layer film or a layered film of an inorganic insulating film of, for example, silicon nitride, silicon oxide, silicon oxide nitride, or the like.

The first TFT 9a is connected to the corresponding gate line 14 and source line 18f in each subpixel P as illustrated in FIG. 3. As illustrated in FIG. 4, the first TFT 9a includes a semiconductor layer 12a provided in an island shape on the base coating film 11, a gate insulating film 13 provided in such a manner as to cover the semiconductor layer 12a, a gate electrode 14a provided on the gate insulating film 13 in such a manner as to overlap part of the semiconductor layer 12a, a first interlayer insulating film 15 and a second interlayer insulating film 17 which are sequentially provided in such a manner as to cover the gate electrode 14a, and a source electrode 18a and a drain electrode 18b which are provided on the second interlayer insulating film 17 to be disposed in such a manner as to be spaced apart from each other. The gate insulating film 13, the first interlayer insulating film 15 and the second interlayer insulating film 17 are made up of a single-layer film or a layered film of an inorganic insulating film of, for example, silicon nitride, silicon oxide, silicon oxide nitride, or the like.

The second TFT 9b is connected to the corresponding first TFT 9a and power supply line 18g in each subpixel P as illustrated in FIG. 3. As illustrated in FIG. 4, the second TFT 9b includes a semiconductor layer 12b provided in an island shape on the base coating film 11, the gate insulating film 13 provided in such a manner as to cover the semiconductor layer 12b, a gate electrode 14b provided on the gate insulating film 13 in such a manner as to overlap part of the semiconductor layer 12b, the first interlayer insulating film 15 and the second interlayer insulating film 17 which are sequentially provided in such a manner as to cover the gate electrode 14b, and a source electrode 18c and a drain electrode 18d which are provided on the second interlayer insulating film 17 to be disposed in such a manner as to be spaced apart from each other.

In the this embodiment, the first TFT 9a and the second TFT 9b are described as being of top-gate type; however, they may be of bottom-gate type TFT.

The capacitor 9c is connected to the corresponding first TFT 9a and power supply line 18g in each subpixel P as illustrated in FIG. 3. The capacitor 9c includes, as illustrated in FIG. 4, a lower conductive layer 14c formed of the same material and in the same layer as those of the gate electrode, the first interlayer insulating film 15 provided in such a manner as to cover the lower conductive layer 14c, and an upper conductive layer 16 provided on the first interlayer insulating film 15 in such a manner as to overlap the lower conductive layer 14c.

The TFT flattening film 19a is made up, for example, of a colorless transparent resin material such as polyimide resin.

The organic EL element 30a includes, as illustrated in FIG. 4, a plurality of first electrodes 21, an edge cover 22a, a plurality of organic EL layers 23, a second electrode 24, and a sealing film 28, all being provided sequentially in that order on the TFT flattening film 19a.

As illustrated in FIG. 4, the plurality of first electrodes 21 are arranged in a matrix configuration over the TFT flattening film 19a in such a manner as to correspond to the plurality of subpixels as reflection electrodes. As illustrated in FIG. 4, the first electrode 21 is connected to the drain electrode 18d of each second TFT 9b via a contact hole formed in the TFT flattening film 19a. The first electrode 21 functions to inject holes (positive holes) into the organic EL layer 23. The first electrode 21 is preferably formed of a material having a large work function to improve the efficiency of hole injection into the organic EL layer 23. Materials making up the first electrode 21 may include metallic materials, for example, silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), lithium fluoride (LiF), and the like. For materials making up the first electrode 21, there may be adopted alloys, for example, of magnesium (Mg)/copper (Cu), magnesium (Mg)/silver (Ag), sodium (Na)/potassium (K), astatine (At)/astatine oxide (AtO$_2$), lithium (Li)/aluminum (Al), lithium (Li)/calcium (Ca)/aluminum (Al), or lithium fluoride (LiF)/calcium (Ca)/aluminum (Al), and the like. For materials making up the first electrode 21, there may be adopted electrically conductive oxides, for example, such as tin oxide (SnO), zinc oxide (ZnO), indium tin oxide (ITO), indium zinc oxide (IZO), and the like. The first electrode 21 may be formed by stacking a plurality of layers formed of any of the materials described above. Examples of materials having a large work function include indium tin oxide (ITO) and indium zinc oxide (IZO).

As illustrated in FIG. 4, the edge cover 22a is provided in the form of a lattice in such a manner as to cover a circumferential edge portion of each first electrode 21. Materials making up the edge cover 22a may include organic films of, for example, polyimide resin, acrylic resin, polysiloxane resin, and novolak resin.

As illustrated in FIG. 4, the plurality of organic EL layers 23 are disposed individually on the first electrodes 21 and are each provided in a matrix configuration so as to correspond to the plurality of subpixels. As illustrated in FIG. 5, each of organic EL layers 23 includes a hole injection layer 1, a hole transport layer 2, a light emitting layer 3, an electron transport layer 4, and an electron injection layer 5, which are provided sequentially in that order over the first electrode 21.

The hole injection layer 1 is also referred to as an anode buffer layer, and functions to reduce an energy level difference between the first electrode 21 and the organic EL layer 23 to thereby improve the efficiency of hole injection into the organic EL layer 23 from the first electrode 21. For materials making up the hole injection layer 1, there are raised, for example, triazole derivative, oxadiazole derivative, imidazole derivative, polyarylalkane derivative, pyrazoline derivative, phenylenediamine derivative, oxazole derivative, styrylanthracene derivative, fluorenone derivative, hydrazone derivative, stilbene derivative, and the like.

The hole transport layer 2 functions to improve the efficiency of hole transport from the first electrode 21 to the organic EL layer 23. Materials making up the hole transport layer 2 may include, for example, porphyrin derivative, aromatic tertiary amine compound, styrylamine derivative, polyvinylcarbazole, poly-p-phenylenevinylene, polysilane, triazole derivative, oxadiazole derivative, imidazole derivative, polyarylalkane derivative, pyrazoline derivative, pyrazolone derivative, phenylenediamine derivative, arylamine derivative, amine-substituted chalcone derivative, oxazole derivative, styrylanthracene derivative, fluorenone derivative, hydrazone derivative, stilbene derivative, hydrogenated amorphous silicon, hydrogenated amorphous silicon carbide, zinc sulfide, zinc selenide, and the like.

The light emitting layer 3 is a region where holes and electrons are injected from the first electrode 21 and the second electrode 24, respectively, and the holes and the electrons recombine, when a voltage is applied via the first electrode 21 and the second electrode 24. The light emitting layer 3 is formed of a material having a high light emitting efficiency. Then, materials making up the light emitting layer 3 may include, for example, metal oxinoid compound [8-hydroxyquinoline metal complex], naphthalene derivative, anthracene derivative, diphenyl ethylene derivative, vinyl acetone derivative, triphenylamine derivative, butadiene derivative, coumarin derivative, benzoxazole derivative, oxadiazole derivative, oxazole derivative, benzimidazole derivative, thiadiazole derivative, benzothiazole derivative, styryl derivative, styrylamine derivative, bisstyrylbenzene derivative, trisstyrylbenzene derivative, perylene derivative, perinone derivative, aminopyrene derivative, pyridine derivative, rhodamine derivative, aquidine derivative, phenoxazone, quinacridone derivative, rubrene, poly-p-phenylenevinylene, and polysilane, and the like.

The electron transport layer 4 functions to facilitate migration of electrons to the light emitting layer 3 efficiently. Materials making up the electron transport layer 4 may include, for example, oxadiazole derivative, triazole derivative, benzoquinone derivative, naphthoquinone derivative, anthraquinone derivative, tetracyanoanthraquinodimethane derivative, diphenoquinone derivative, fluorenone derivative, silole derivative, metal oxinoid compound, and the like.

The electron injection layer 5 functions to reduce an energy level difference between the second electrode 24 and the organic EL layer 23 to thereby improve the efficiency of electron injection into the organic EL layer 23 from the second electrode 24, and the electron injection layer 5 can reduce the drive voltage of the organic EL element 30a by this function. The electron injection layer 5 is also referred to as a cathode buffer layer. Materials making up the electron injection layer 5 may include, for example, inorganic alkaline compounds such as lithium fluoride (LiF), magnesium fluoride (MgF$_2$), calcium fluoride (CaF$_2$), strontium fluoride (SrF$_2$), and barium fluoride (BaF$_2$), aluminum oxide (Al$_2$O$_3$), strontium oxide (SrO), and the like.

As illustrated in FIG. 4, the second electrode 24 is disposed to cover the organic EL layer 23 and the edge cover 22a. The second electrode 24 functions to inject electrons into the organic EL layer 23. The second electrode 24 is preferably formed of a material having a small work function to improve the efficiency of electron injection into the organic EL layer 23. Materials making up the second electrode 24 may include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), lithium fluoride (LiF), and the like. The second electrode 24 may be formed of alloys of magnesium (Mg)/copper (Cu), magnesium (Mg)/silver (Ag), sodium (Na)/potassium (K), astatine (At)/astatine oxide (AtO$_2$), lithium (Li)/aluminum (Al), lithium (Li)/calcium (Ca)/aluminum (Al), lithium fluoride (LiF)/calcium (Ca)/aluminum (Al), and the like. The second electrode 24 may be formed of an electrically conductive oxide such as tin oxide (SnO), zinc oxide (ZnO), indium tin oxide (ITO), and indium zinc oxide (IZO). The second electrode 24 may include a stack of a plurality of layers of any of the materials described above. Materials having a small work function may include, for example, magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), lithium fluoride (LiF)/calcium (Ca)/aluminum (Al), and the like.

The sealing film 28 includes, as illustrated in FIG. 4, a first inorganic film 25 provided in such a manner as to cover the second electrode 24, an organic film 26 provided in such a manner as to cover the first inorganic film 25, and a second inorganic film 27 provided in such a manner as to cover the organic film 26 and functions to protect the organic EL layer 23 from water and oxygen. The first inorganic film 25 and the second inorganic film 27 may be made up of an inorganic material, for example, silicon oxide (SiO$_2$) or aluminum oxide (Al$_2$O$_3$), silicon nitride (SiNx (x denoting a positive integer) such as trisilicon tetranitride (Si$_3$N$_4$), or silicon carbide nitride (SiCN). The organic film 26 is made up of an organic material such as acrylate, polyurea, parylene, polyimide, or polyamide.

Figure 6:
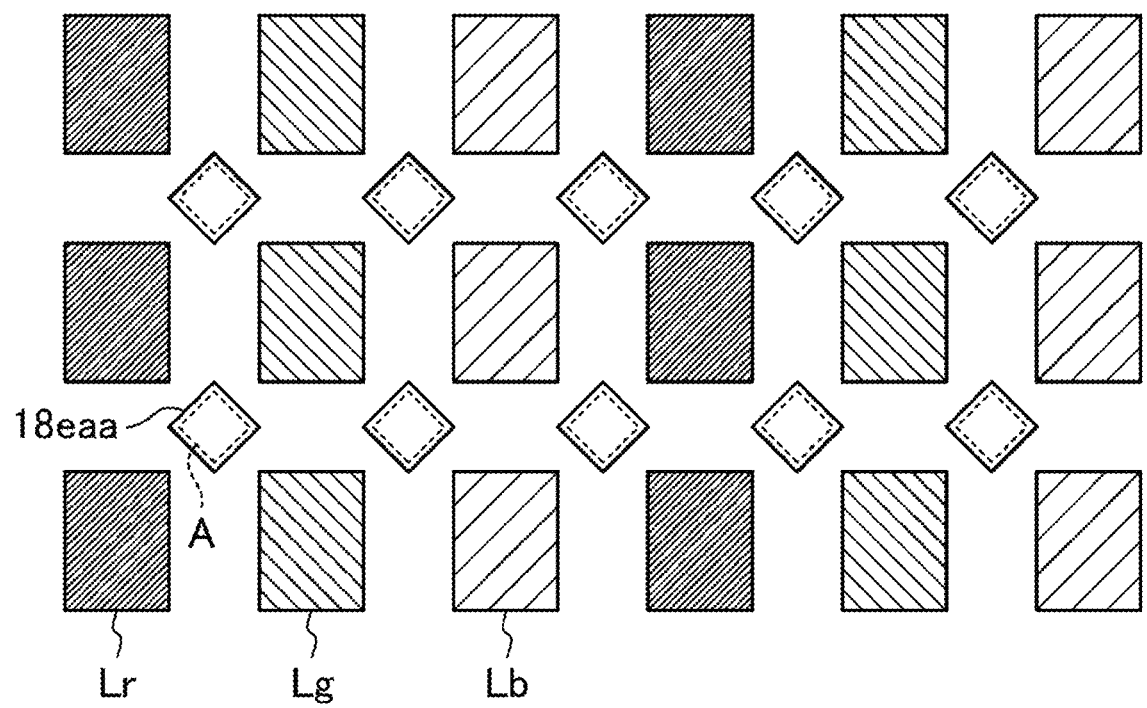
FIG. 6 is a plan view illustrating an arrangement of opening portions and metallic layers of a first modified example of the organic EL display device according to the first embodiment of the disclosure.
Figure 7:
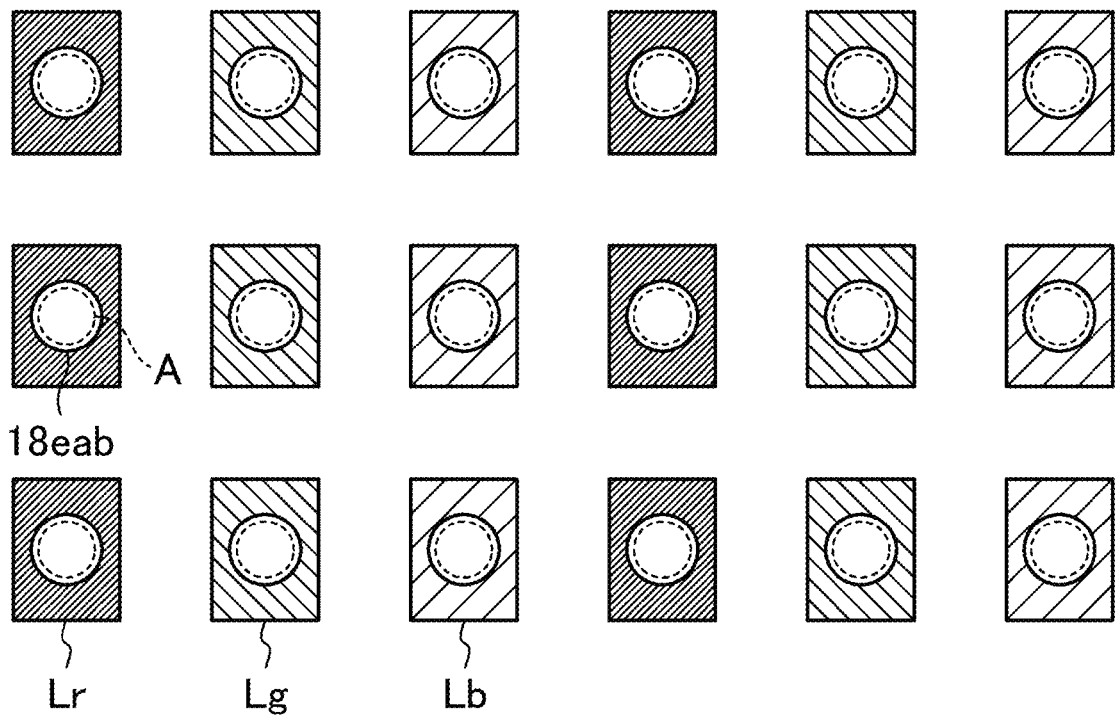
FIG. 7 is a plan view illustrating an arrangement of opening portions and metallic layers of a second modified example of the organic EL display device according to the first embodiment of the disclosure.
Figure 8:
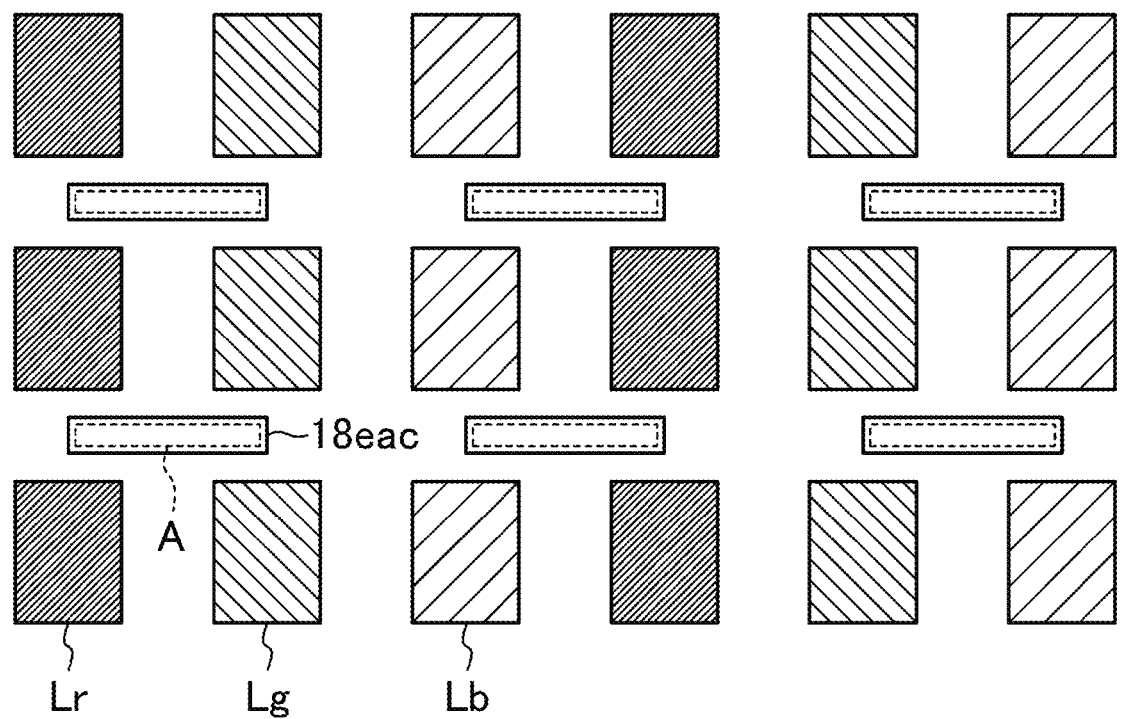
FIG. 8 is a plan view illustrating an arrangement of opening portions and metallic layers of a third modified example of the organic EL display device according to the first embodiment of the disclosure.
Figure 9:
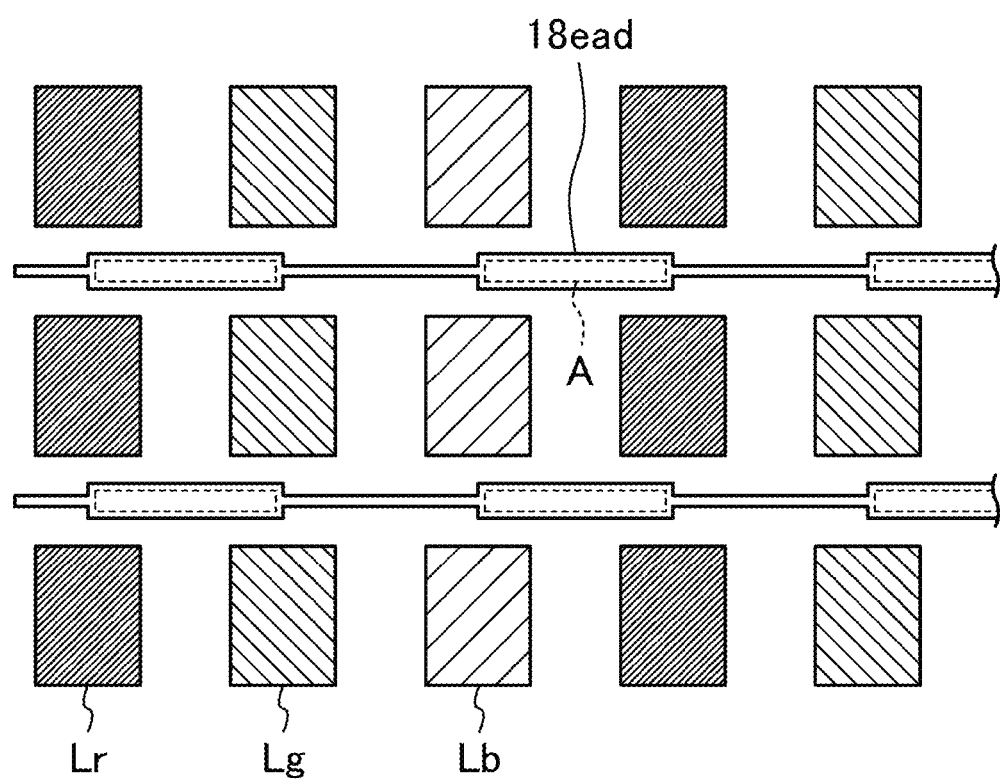
FIG. 9 is a plan view illustrating an arrangement of opening portions and metallic layers of a fourth modified example of the organic EL display device according to the first embodiment of the disclosure.

In the organic EL display device 50a, as illustrated in FIG. 4, in each subpixel P in the display region D, an opening portion A is formed in an inorganic insulating layered film of the base coating film 11, the gate insulating film 13, the first interlayer insulating film 15, and the second interlayer insulating film 17, which make up the TFT layer 20a in such a manner as to penetrate the inorganic insulating layered film to expose an upper surface of the resin substrate layer 10, an opening flattening film 8 is provided in such a manner as to fill in the opening portion A, and a metallic layer 18ea is provided in such a manner as to cover an upper surface side of the opening flattening film 8. In this way, by adopting the configuration in which the opening flattening film 8 is provided in such a manner as to cover a whole surface of the opening portion A, and the metallic layer 18ea is provided in such a manner as to cover the whole surface of the opening flattening film 8, since the metallic layer 18ea is sandwiched between the opening flattening film 8 that is in contact with the resin substrate layer 10 and the TFT flattening film 19a, an intrusion of water from the resin substrate layer 10 can be suppressed. The opening flattening film 8 is made up of a colorless transparent organic resin material such as polyimide resin, for example. The metallic layer 18ea is formed in the same layer and of the same material as those of the source line 18f, and the like. A plurality of opening portions A provided in the display region D may be disposed in a zigzag pattern when seen from above by disposing the individual opening portions A formed in the subpixels P in such a manner as to deviate from one another in an oblique direction, as illustrated in FIG. 2. By adopting this configuration, even when a crack is generated in the base coating film 11, the gate insulating film 13, the first interlayer insulating film 15, and the second interlayer insulating film 17, an extension of the crack can be prevented. Then, the opening portions A provided in the display region D and metallic layers 18eaa that overlap the corresponding opening portions A via the opening flattening film 8 may be formed in an island shape (a substantially diamond shape) between the red light emitting regions Lr, the green light emitting regions Lg, and the blue light emitting regions Lb, as illustrated in FIG. 6. In addition, the opening portions A provided in the display region D and metallic layers 18eab that overlap the corresponding opening portions A via the opening flattening film 8 may be formed in an island shape (a substantially circular shape) in such a manner as to be superposed on the red light emitting regions Lr, the green light emitting regions Lg, and the blue light emitting regions Lb, as illustrated in FIG. 7. Additionally, the opening portions A provided in the display region D and metallic layers 18eac that overlap the corresponding opening portions A via the opening flattening film 8 may be formed in an island shape (a substantially rectangular shape) between the red light emitting regions Lr, the green light emitting regions Lg, and the blue light emitting regions Lb, as illustrated in FIG. 8. The metallic layers 18eac in FIG. 8 may be metallic layers 18ead which are coupled together in a horizontal direction in FIG. 9 as illustrated in the figure to be connected to a high-level power supply line 18g (ELVDD, refer to FIG. 3) to lower the resistance of the high-level power supply line 18g. The metallic layers 18eaa, 18eab, 18eac, and 18ead may be formed in the same layer and of the same material as those of the source line 18f and may be made up of, for example, a metallic conductive film having bending resistance and formed of aluminum, copper, or silver.

The organic EL display device 50a described above is configured such that, in each subpixel P, a gate signal is input into the first TFT 9a via the gate line 14 to thereby turn on the first TFT 9a, a predetermined voltage corresponding to a source signal is written in the gate electrode 14b of the second TFT 9b and the capacitor 9c via the source line 18f, the magnitude of current from the power supply line 18g is specified based on a gate voltage of the second TFT 9b, and the specified current is supplied to the organic EL layer 23, whereby the light emitting layer 3 of the organic EL layer 23 emits light to display an image. In the organic EL display 50a, since even when the first TFT 9a is turned off, the gate voltage of the second TFT 9b is held by the capacitor 9c, the light emitting layer 3 is kept emitting light until a gate signal of the next frame is input.

The organic EL display device 50a of this embodiment can be manufactured, for example, by forming the TFT layer 20a and the organic EL element 30a on the front surface of the resin substrate layer 10 formed on the glass substrate by use of a known method, and then peeling the glass substrate from the resin substrate layer 10.

Thus, as has been described heretofore, according to the organic EL display device 50a of this embodiment, since the opening portion A is formed in the inorganic insulating layered film of the base coating film 11, the gate insulating film 13, the first interlayer insulating film 15, and the second interlayer insulating film 17 that make up the TFT layer 20a in each of the subpixels of the display region D, the organic EL display device 50a can easily be bent at the display region D. Then, since the opening flattening film 8 is provided over the opening portion A in the inorganic insulating layered film, and the metallic layer 18ea is provided in such a manner as to cover the upper surface side of the opening flattening film 8, the intrusion of water from the resin substrate layer 10 into the organic EL element 30a can be suppressed by the metallic layer 18ea. Since this configuration can suppress the damage to the TFT layer 20a that would be made when it is bent at the display region D, the damage to the organic EL element 30a that would be caused by the damage of the TFT layer 20a, and the damage to the organic EL element 30a that would be caused by the intrusion of water, the damage to the organic EL element 30a resulting from bending in the display region D can be suppressed.

Second Embodiment

Figure 10:
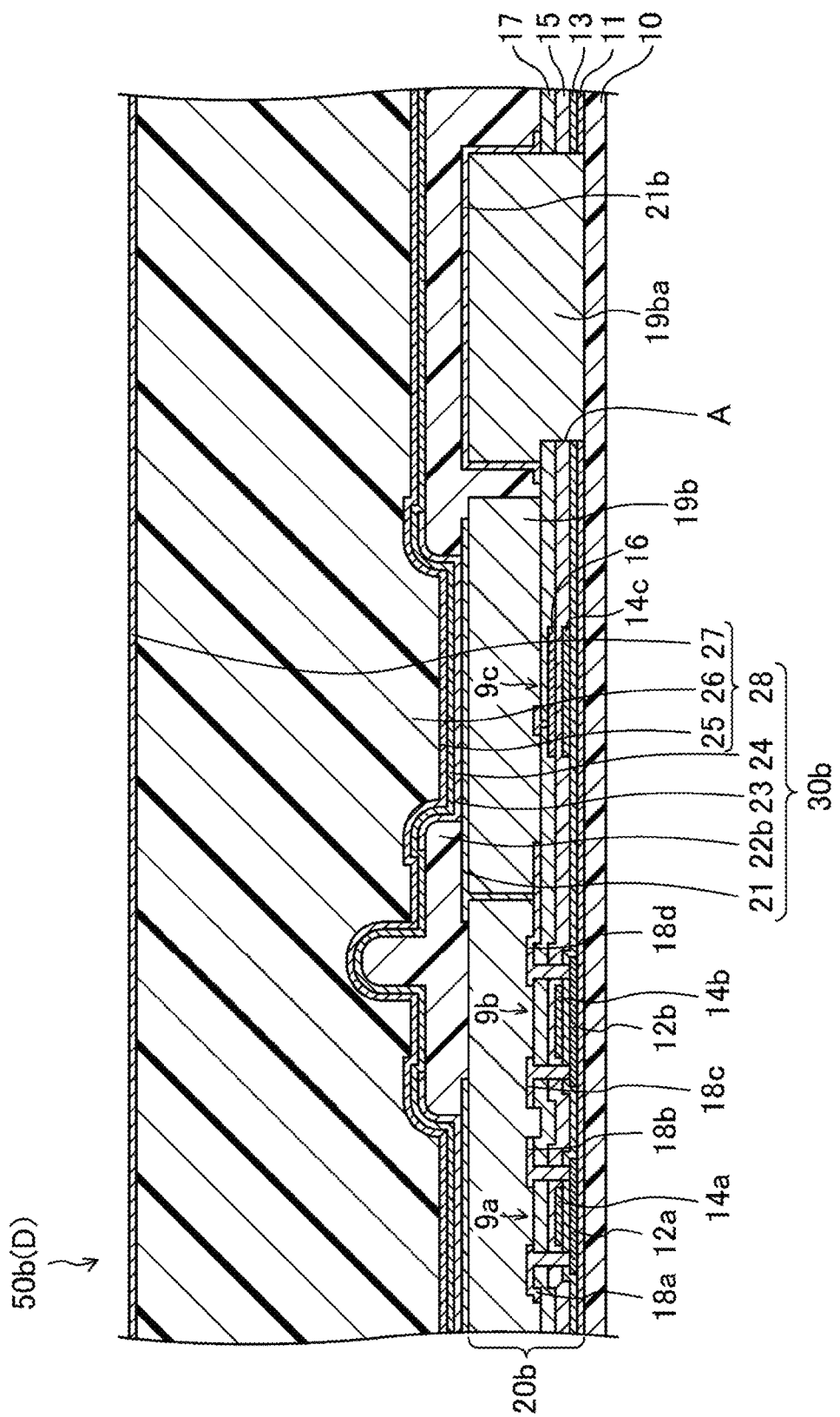
FIG. 10 is a cross-sectional view of a display region of an organic EL display device according to a second embodiment of the disclosure.

FIG. 10 illustrates a second embodiment of a display device according to the disclosure. FIG. 10 is a cross-sectional view of a display region D of an organic EL display device 50b of this embodiment. In the following embodiment, the same reference signs will be given to the same portions as those illustrated in FIGS. 1 to 9, so that a detailed description thereof will be omitted.

While the first embodiment illustrates the organic EL display device 50a in which the metallic layer 18ea is provided in the same layer and is formed of the same material as those of the source layer, this embodiment illustrates an organic EL display device 50b in which a metallic layer 21b is provided in the same layer and is formed of the same material as those of a first electrode 21.

The organic EL display device 50b includes a display region D configured to display an image specified in a rectangular shape, and a frame region F defined to surround the display region D. As illustrated in FIG. 10, the organic EL display device 50b includes a resin substrate layer 10, and an organic EL element 30b provided on the resin substrate layer 10 via a TFT layer 20b and making up the display region D.

As illustrated in FIG. 10, the TFT layer 20b includes a base coating film 11 provided on the resin substrate layer 10, a plurality of first TFTs 9a, a plurality of second TFTs 9b, a plurality of capacitors 9c (the first TFTs 9a, the second TFTs 9b and the capacitors 9c are all provided on the base coating film 11), and a TFT flattening film 19b provided on the first TFTs 9a, the second TFTs 9b, and the capacitors 9c. Here, in the TFT layer 20b, a plurality of gate lines 14 are provided in such a manner as to extend parallel to each other. In the TFT layer 20b, a plurality of source lines 18f are provided in such a manner as to extend parallel to each other. In the TFT layer 20b, a plurality of power supply lines 18g are provided in such a manner as to extend parallel to each other while being disposed adjacent to the corresponding source lines 18f. In the TFT layer 20b, each subpixel P includes the first TFT 9a, the second TFT 9b, and the capacitor 9c respectively.

The TFT flattening film 19b includes, for example, a colorless transparent organic resin material such as polyimide resin.

The organic EL element 30b includes, as illustrated in FIG. 10, a plurality of first electrodes 21, an edge cover 22b, a plurality of organic EL layers 23, a second electrode 24, and a sealing film 28, which are provided sequentially in that order on the TFT flattening film 19b.

As illustrated in FIG. 10, the edge cover 22b is disposed in a lattice pattern in such a manner as to surround circumferential edge portions of the first electrodes 21. Materials making up the edge cover 22b may include organic films of, for example, polyimide resin, acrylic resin, polysiloxane resin, novolak resin, and the like.

In the organic EL display device 50b, as illustrated in FIG. 10, in each subpixel P in the display region D, an opening portion A is formed in an inorganic insulating layered film of the base coating film 11, the gate insulating film 13, the first interlayer insulating film 15, and the second interlayer insulating film 17, which make up the TFT layer 20b in such a manner as to penetrate the inorganic insulating layered film to expose an upper surface of the resin substrate layer 10, an opening flattening film 19ba is provided in such a manner as to fill in the opening portion A, and a metallic layer 21b is provided in such a manner as to cover an upper surface side of the opening flattening film 8. The opening flattening film 19ba is provided in the same layer and is formed of the same material as those of the TFT flattening film 19b. The metallic layer 21b is provided in the same layer and is formed of the same material as those of the first electrode 21.

As with the organic EL display device 50a of the first embodiment, the organic EL display device 50b described above is flexible and displays an image by causing a light emitting layer 3 of the organic EL layer 23 to emit light as required via the first TFT 9a and the second TFT 9b in each subpixel P.

Thus, as has been described heretofore, according to the organic EL display device 50b of this embodiment, since the opening portion A is formed in the inorganic insulating layered film of the base coating film 11, the gate insulating film 13, the first interlayer insulating film 15 and the second interlayer insulating film 17 that make up the TFT layer 20a in each of the subpixels P of the display region D, the organic EL display device 50b can easily be bent at the display region D. Then, since the opening flattening film 19ba is provided over the opening portion A in the inorganic insulating layered film, and the metallic layer 21b is provided in such a manner as to cover the upper surface side of the opening flattening film 19ba, the intrusion of water from the resin substrate layer 10 into the organic EL element 30b can be suppressed by the metallic layer 21b. Since this configuration can suppress the damage to the TFT layer 20b that would be made when it is bent at the display region D, the damage to the organic EL element 30b that would be caused by the damage of the TFT layer 20b, and the damage to the organic EL element 30b that would be caused by the intrusion of water, the damage to the organic EL element 30b resulting from bending in the display region D can be suppressed.

Third Embodiment

Figure 11:
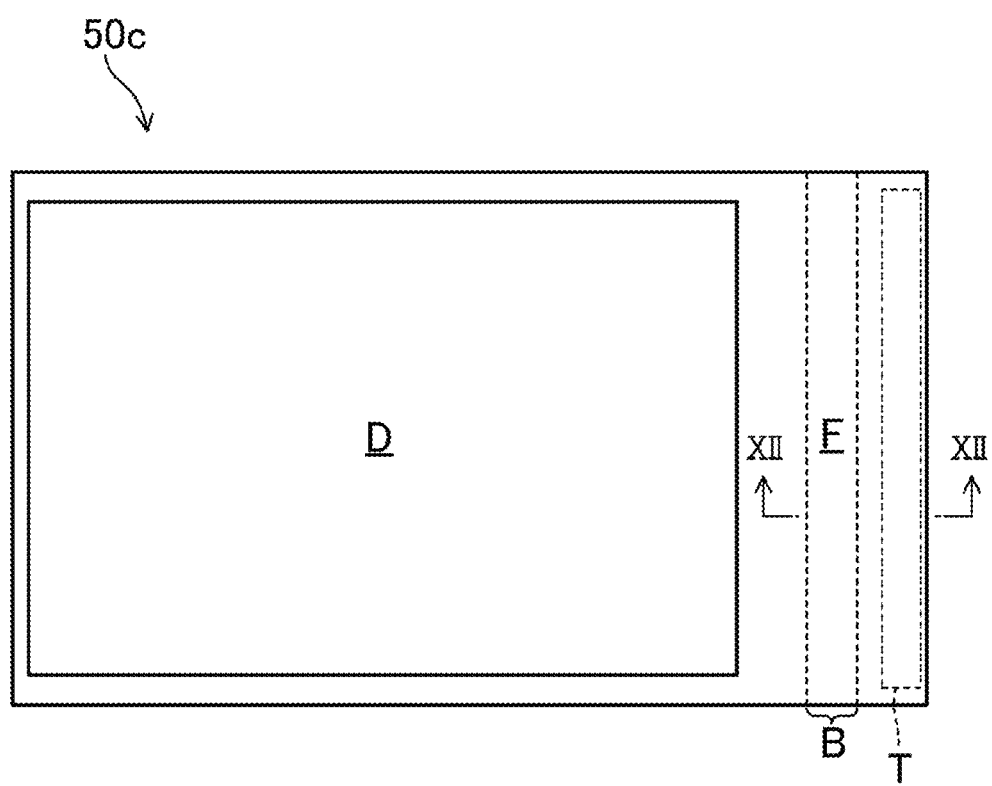
FIG. 11 is a plan view of an organic EL display device according to a third embodiment of the disclosure.
Figure 12:
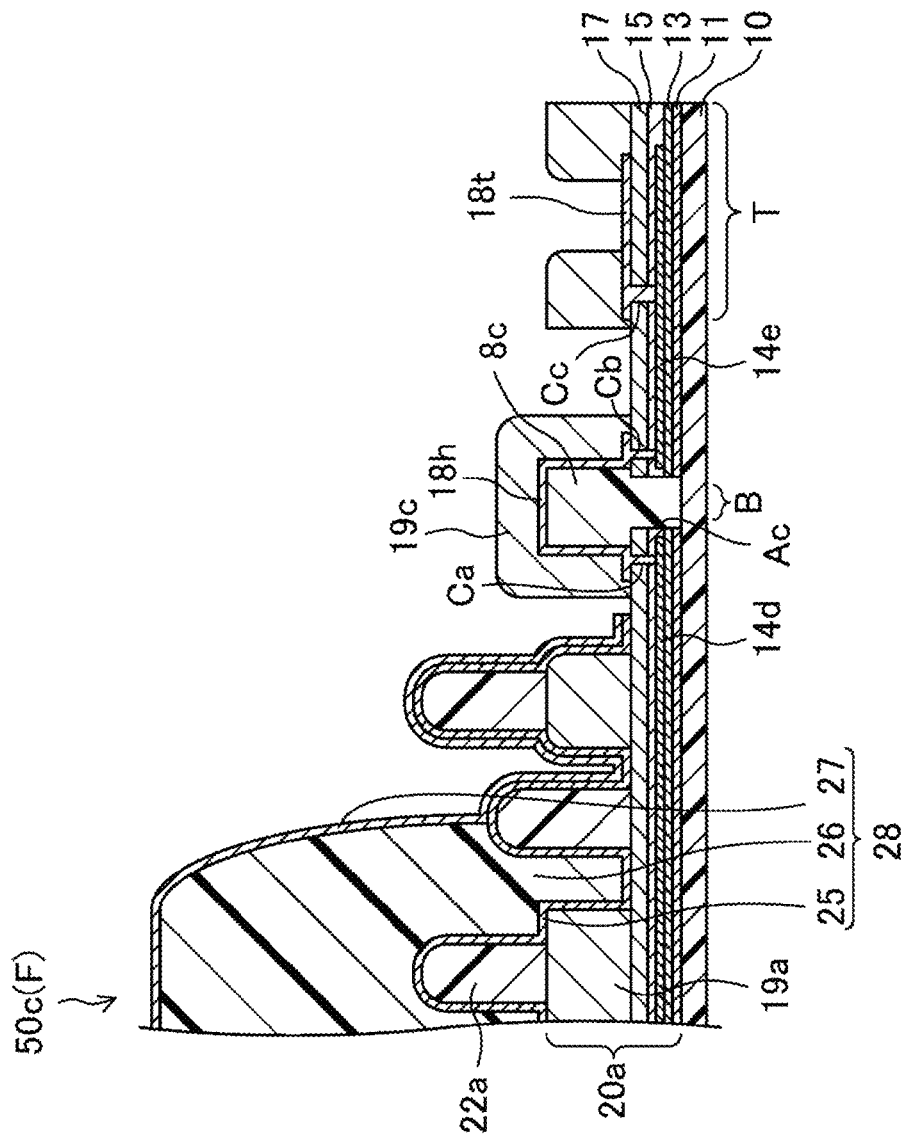
FIG. 12 is a cross-sectional view of a frame region of the organic EL display device taken along line XII-XII of FIG. 11.
Figure 13:
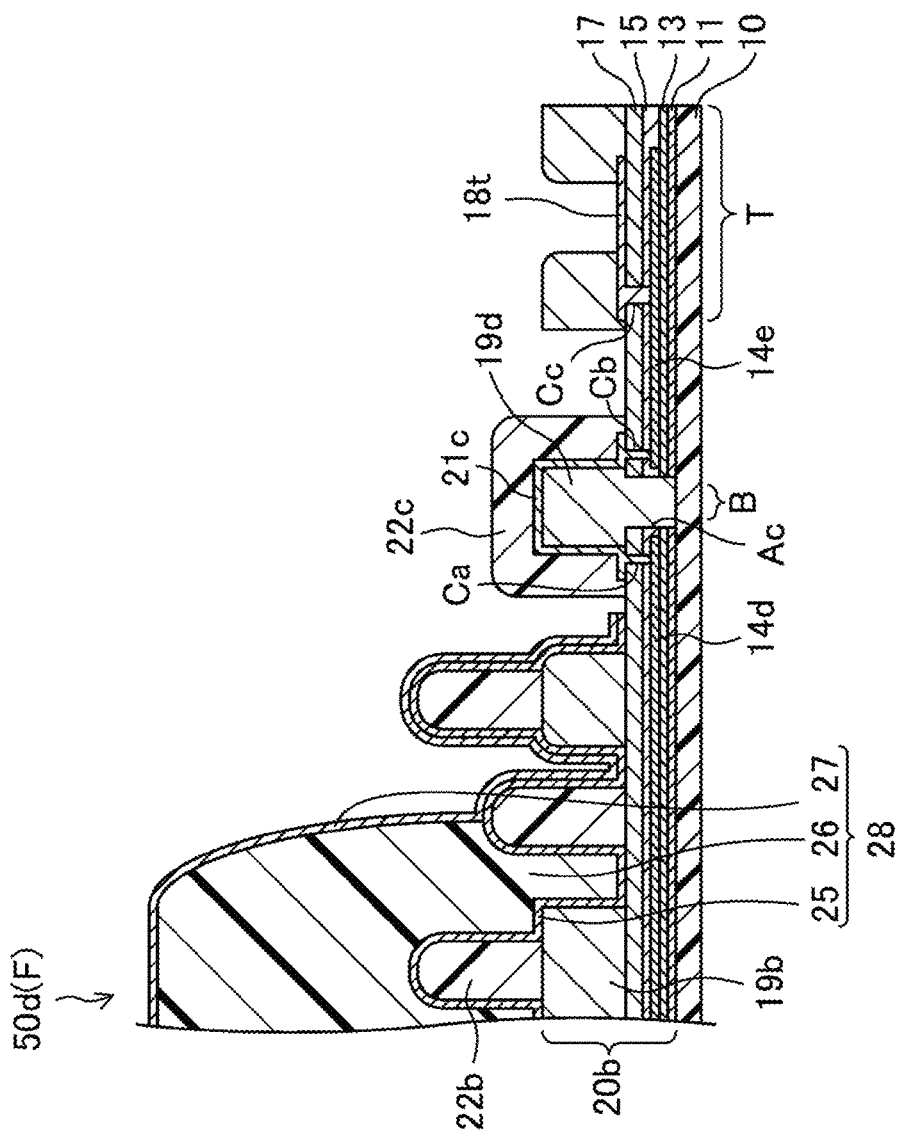
FIG. 13 is a cross-sectional view of a modified example of the organic EL display device according to the third embodiment of the disclosure, corresponding to FIG. 12.

FIGS. 11 to 13 illustrate a third embodiment of a display device according the disclosure. FIG. 11 is a plan view of an organic EL display device 50c of this embodiment. FIG. 12 is a cross-sectional view of a frame region F of the organic EL display device 50c taken along a line XII-XII in FIG. 11. FIG. 13 is a cross-sectional view of a frame region F of an organic EL display device 50d, which constitutes a modified example made to the organic EL display device 50c, corresponding to FIG. 12.

While the first and second embodiments illustrate the organic EL display device 50a and the organic EL display device 50b, respectively, in which no consideration is taken in relation to bending in the frame region F, this embodiment illustrates the organic EL display device 50c including a bending portion B provided in the frame region F.

As illustrated in FIG. 11, the organic EL display device 50c includes a display region D configured to display an image specified in a rectangular shape, a frame region F defined to surround the display region D, a terminal portion T provided at an end portion of the frame region F, and a bending portion B provided between the display region D and the terminal portion T. Here, as illustrated in FIG. 11, the bending portion B is provided in such a manner as to follow one side (a right side in the figure) of the display region D so that the bending portion B can be bent 180 degrees (into a U shape) about a vertical direction in the figure as a bending axis.

The display region D of the organic EL display device 50c has the same configuration as that of the organic EL display device 50a of the first embodiment described above.

As illustrated in FIG. 12, the organic EL display device 50c includes, in the frame region F: the resin substrate layer 10; an inorganic insulating layered layer of a base coating film 11, a gate insulating film 13, a first interlayer insulating film 15 and a second interlayer insulating film 17, which are provided sequentially on the resin substrate layer 10; an opening portion Ac formed in the inorganic insulating layered layer; a frame flattening film 8c provided in such a manner as to fill in the opening portion Ac; a frame wiring line 18h provided on the frame flattening film 8c; and a resin film 19c provided in such a manner as to cover the frame wiring line 18h. Here, the opening portion Ac is formed in the bending portion B in such a manner as to penetrate the inorganic insulating layered film of the base coating film 11, the gate insulating film 13, the first interlayer insulating film 15, and the second interlayer insulating film 17, which make up the TFT layer 20a, to thereby expose an upper surface of the resin substrate layer 10.

The frame flattening film 8c is provided in the same layer and is formed of the same material as those of an opening flattening film 8.

The frame wiring line 18h is provided in the same layer and is formed of the same material as those of a source line 18f and the like. One end portion of the frame wiring line 18h is connected to a gate conductive layer 14d via a contact hole Ca formed in a layered film of the first interlayer insulating film 15 and the second interlayer insulating film 17, as illustrated in FIG. 12. The other end portion of the frame wiring line 18h is connected to a gate conductive layer 14e via a contact hole Cb formed in the layered film of the first interlayer insulating film 15 and the second interlayer insulating film 17, as illustrated in FIG. 12. Here, the gate conductive layer 14d is provided in the same layer and is formed of the same material as those of the gate electrodes 14a and 14b, being connected to a wiring line of the TFT layer 20a. The gate conductive layer 14e is provided in the same layer and is formed of the same material as those of the gate electrodes 14a and 14b and is connected to a source conductive layer (a wiring line terminal) 18t of the terminal portion T via a contact hole Cc formed in the layered film of the first interlayer insulating film 15 and the second interlayer insulating film 17, as illustrated in FIG. 12.

The resin film 19c is provided in the same layer and is formed of the same material as those of a TFT flattening film 19a.

As with the organic EL display devices 50a and 50b of the first and second embodiments, the organic EL display device 50b described above is flexible and displays an image by causing a light emitting layer 3 of the organic EL layer 23 to emit light as required via the first TFT 9a and the second TFT 9b in each subpixel P.

While this embodiment illustrates the organic EL display device 50c in which the frame wiring line 18h is provided in the same layer and is formed of the same material as those of the source line 18f, an organic EL display device 50d may be adopted in which a frame wiring line 21c is provided in the same layer and is formed of the same material as those of a first electrode 21, as illustrated in FIG. 13. Specifically, in the organic EL display device 50d, as illustrated in FIG. 13, a frame flattening film 19d is provided in such a manner as to fill in an opening portion Ac formed in an inorganic insulating layered film of a base coating film 11, a gate insulating film 13, a first interlayer insulating film 15, and a second interlayer insulating film 17, which make up a TFT layer 20b, a frame wiring line 21c is provided on the frame flattening film 19d, and a resin film 22c is provided in such a manner as to cover the frame wiring line 21c. Here, one end portion of the frame wiring line 21c is connected to a gate conductive layer 14d via a contact hole Ca formed in a layered film of the first interlayer insulating film 15 and the second interlayer insulating film 17, as illustrated in FIG. 13. The gate conductive layer 14d is connected to a wiring line of the TFT layer 20b. The other end portion of the frame wiring line 21c is connected to a gate conductive layer 14e via a contact hole Cb formed in the layered film of the first interlayer insulating film 15 and the second interlayer insulating film 17, as illustrated in FIG. 13. The frame flattening film 19d is provided in the same layer and is formed of the same material as those of a TFT flattening film 19b. A resin film 22c is provided in the same layer and is formed of the same material as those of an edge cover 22b. A display region D of the organic EL display device 50d has the same configuration as that of the organic EL display device 50b of the second embodiment described above.

Thus, as has been described heretofore, according to the organic EL display devices 50c and 50d of this embodiment, since the opening portion Ac is formed in the inorganic insulating layered film of the base coating film 11, the gate insulating film 13, the first interlayer insulating film 15, and the second interlayer insulating film 17 at the bending portion B of the frame region F, the occurrence of a film fracture of the inorganic insulating layered film and a disconnection of the frame wiring lines 18h and 21c can be suppressed.

Other Embodiments

In the above embodiments, while the organic EL display devices 50a to 50d are illustrated, the disclosure can also be applied to an organic EL display device in which the components of the illustrated organic EL display devices 50a to 50d are combined freely.

In the embodiments described above, while the organic EL layer of the five-layer structure including the hole injection layer, the hole transport layer, the light emitting layer, the electron transport layer, and the electron injection layer is described as presenting the example, the organic EL layer may include a three-layer structure including a hole injection-cum-transport layer, a light emitting layer, and an electron transport-cum-injection layer.

In the embodiments described above, while the organic EL display devices are described as including the first electrode as an anode electrode and the second electrode as a cathode electrode, the disclosure can also be applicable to an organic EL display device in which the layer stacking structure of the organic EL is reversed in such a way that the first electrode constitutes a cathode electrode and the second electrode constitutes an anode electrode.

In the embodiments described above, while the organic EL display device is described as using the electrode of the TFT connected to the first electrode as the drain electrode, the disclosure can also be applied to an organic EL display device in which an electrode of a TFT connected to a first electrode is referred to as a source electrode.

In the embodiments, while the organic EL display device is described as being used as a display device, the disclosure can also be applied to, for example, a display device including quantum dot light emitting diodes (QLEDs), which are a light emitting element using a quantum dot-containing layer.

INDUSTRIAL APPLICABILITY

As has been described heretofore, the disclosure is useful for flexible display devices.

REFERENCE SIGNS LIST

A, Ac Opening portion
B Bending portion
D Display region
F Frame region
Lb Blue light emitting region
Lr Red light emitting region
Lg Green light emitting region
P Subpixel
T Terminal portion
8, 19ba Opening flattening film
8C, 19d Frame flattening film
10 Resin substrate layer (resin substrate)
11 Base coating film (inorganic insulating film)

13 Gate insulating film (inorganic insulating film)
15 First interlayer insulating film (inorganic insulating film)
17 Second interlayer insulating film (inorganic insulating film)
18a, 18c Source electrode
18ea, 18eaa to 18ead, 21b Metallic layer
18g Power supply line
18h, 21c Frame wiring line
19a, 19b TFT flattening film
20a, 20b TFT layer
21 First electrode (reflection electrode)
30a, 30b Organic EL element (light-emitting element)
50a to 50d Organic EL display device

The invention claimed is:

1. A display device comprising:
a resin substrate; and
a light emitting element provided on the resin substrate via a TFT layer, the light emitting element making up a display region,
wherein, in the display region, an opening portion is formed in at least a layer of an inorganic insulating film making up the TFT layer in such a manner as to penetrate the inorganic insulating film to expose an upper surface of the resin substrate,
an opening flattening film is provided in such a manner as to fill in the opening portion,
a metallic layer is provided in such a manner as to cover an upper surface side of the opening flattening film,
a plurality of subpixels are arranged in a matrix configuration in the display region,
each of the subpixels includes a light emitting region, and
the opening portion is formed in an island shape to be superposed on the light emitting region.

2. The display device according to claim 1, wherein the plurality of opening portions are formed into a zigzag pattern when seen from above.

3. The display device according to claim 1, wherein the opening flattening film is in contact with the upper surface of the resin substrate.

4. The display device according to claim 1, wherein
the opening flattening film is provided to cover a whole surface of the opening portion, and
the metallic layer is provided to cover a whole surface of the opening flattening film.

5. The display device according to claim 1, wherein the metallic layer is electrically floating.

6. The display device according to claim 1, wherein
the TFT layer includes a source electrode, and
the metallic layer is provided in the same layer and is formed of the same material as those of the source electrode.

7. The display device according to claim 1, wherein
the TFT layer includes a source electrode, and
the metallic layer is provided in the same layer and is formed of the same material as those of the source electrode, and is electrically connected to a high-level power supply line.

8. The display device according to claim 1, comprising:
a frame region provided to surround the display region;
a terminal portion provided at an end portion of the frame region; and
a bending portion provided between the terminal portion and the display region,
wherein an opening portion is formed in at least an inorganic insulating film making up the TFT layer to penetrate the inorganic insulating film to thereby expose the upper surface of the resin substrate,
a frame flattening film is provided to fill in the opening portion,
a frame wiring line is provided on the frame flattening film, at the bending portion,
the TFT layer includes a TFT flattening film, and
the frame flattening film is provided in the same layer and is formed of the same material as those of the opening flattening film.

9. The display device according to claim 1, wherein the light emitting element includes a reflection electrode,
the TFT layer has a TFT flattening film on a side facing the light emitting element,
the metallic layer is provided in the same layer and is formed of the same material as those of the reflection electrode, and
the opening flattening film is provided in the same layer and is formed of the same material as those of the TFT flattening film.

10. The display device according to claim 9, wherein the metallic layer is not electrically connected to the reflection electrode.

11. The display device according to claim 9, comprising:
a frame region provided to surround the display region;
a terminal portion provided at an end portion of the frame region; and
a bending portion provided between the terminal portion and the display region,
wherein an opening portion is formed in at least an inorganic insulating film making up the TFT layer to penetrate the inorganic insulating film to thereby expose the upper surface of the resin substrate,
a frame flattening film is provided to fill in the opening portion,
a frame wiring line is provided on the frame flattening film, at the bending portion, and
the frame flattening film is provided in the same layer and is formed of the same material as those of the TFT flattening film.

12. The display device according to claim 1, wherein the light emitting element includes an organic EL element.

13. A display device comprising:
a resin substrate; and
a light emitting element provided on the resin substrate via a TFT layer, the light emitting element making up a display region,
wherein, in the display region, an opening portion is formed in at least a layer of an inorganic insulating film making up the TFT layer in such a manner as to penetrate the inorganic insulating film to expose an upper surface of the resin substrate,
an opening flattening film is provided in such a manner as to fill in the opening portion,
a metallic layer is provided in such a manner as to cover an upper surface side of the opening flattening film, in the display region,
a plurality of subpixels are arranged in a matrix configuration in the display region,
each of the subpixels includes a light emitting region, and
the opening portion is formed in an island shape between the light emitting regions.

14. The display device according to claim 13, wherein
the opening flattening film is provided to cover a whole surface of the opening portion, and
the metallic layer is provided to cover a whole surface of the opening flattening film.

15. The display device according to claim 13, wherein the metallic layer is electrically floating.

16. The display device according to claim 13, wherein the TFT layer includes a source electrode, and
the metallic layer is provided in the same layer and is formed of the same material as those of the source electrode.

17. The display device according to claim 13, wherein the TFT layer includes a source electrode, and
the metallic layer is provided in the same layer and is formed of the same material as those of the source electrode, and is electrically connected to a high-level power supply line.

18. The display device according to claim 13, comprising:
a frame region provided to surround the display region;
a terminal portion provided at an end portion of the frame region; and
a bending portion provided between the terminal portion and the display region, wherein
an opening portion is formed in at least an inorganic insulating film making up the TFT layer to penetrate the inorganic insulating film to thereby expose the upper surface of the resin substrate,
a frame flattening film is provided to fill in the opening portion,
a frame wiring line is provided on the frame flattening film, at the bending portion,
the TFT layer includes a TFT flattening film, and
the frame flattening film is provided in the same layer and is formed of the same material as those of the opening flattening film.

19. The display device according to claim 13, wherein the light emitting element has a reflection electrode,
the TFT layer includes a TFT flattening film on a side facing the light emitting element,
the metallic layer is provided in the same layer and is formed of the same material as those of the reflection electrode, and
the opening flattening film is provided in the same layer and is formed of the same material as those of the TFT flattening film.

20. The display device according to claim 19, wherein the metallic layer is not electrically connected to the reflection electrode.

* * * * *